United States Patent
Kotabe et al.

(10) Patent No.: US 7,180,768 B2
(45) Date of Patent: Feb. 20, 2007

(54) SEMICONDUCTOR MEMORY DEVICE INCLUDING 4TSRAMS

(75) Inventors: Akira Kotabe, Tokyo (JP); Kenichi Osada, Tokyo (JP); Masahiro Moniwa, Itami (JP); Shiro Kamohara, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/878,050

(22) Filed: Jun. 29, 2004

(65) Prior Publication Data

US 2005/0047197 A1    Mar. 3, 2005

(30) Foreign Application Priority Data

Sep. 2, 2003    (JP) ............................ 2003-309566

(51) Int. Cl.
*G11C 11/00* (2006.01)
(52) U.S. Cl. ................. 365/154; 365/156; 365/230.06; 257/135
(58) Field of Classification Search ................ 365/154, 365/203, 156, 230.06; 257/135
See application file for complete search history.

(56) References Cited

U.S. PATENT DOCUMENTS

| | | | | |
|---|---|---|---|---|
| 4,751,683 A | * | 6/1988 | Wada et al. | ............. 365/233.5 |
| 6,212,124 B1 | | 4/2001 | Noda | |
| 6,259,623 B1 | | 7/2001 | Takahashi | |
| 6,344,992 B1 | * | 2/2002 | Nakamura | .................. 365/154 |
| 6,608,780 B2 | * | 8/2003 | Shau | ..................... 365/189.01 |
| 2002/0051379 A1 | | 5/2002 | Deng et al. | |
| 2003/0007380 A1 | * | 1/2003 | Houston | ..................... 365/154 |
| 2003/0032250 A1 | | 2/2003 | Imai | |
| 2004/0100816 A1 | * | 5/2004 | Forbes | ........................ 365/154 |

FOREIGN PATENT DOCUMENTS

JP    2003-133441    5/2003

* cited by examiner

*Primary Examiner*—Huan Hoang
(74) *Attorney, Agent, or Firm*—Mattingly, Stanger, Malur & Brundidge, P.C.

(57) ABSTRACT

Disclosed is a method of improving stability of a memory cell in read mode in an SRAM including a memory cell comprising two access MOS transistors and two drive MOS transistors. The magnitude of voltage between gate and source of an access transistor of a memory cell connected to a selected word line is controlled to be smaller than a power-supply voltage by controlling the voltage of selected word line WL in read mode.

10 Claims, 10 Drawing Sheets

000
SEMICONDUCTOR MEMORY DEVICE INCLUDING 4TSRAMS

CLAIM OF PRIORITY

The present application claims priority from Japanese application JP 2003-309566 filed on Sep. 2, 2003, the content of which is hereby incorporated by reference into this application.

FIELD OF THE INVENTION

The present invention relates to a semiconductor memory device and more particularly to the reading operation of SRAM including a memory cell comprising two access MOS transistors and two drive MOS transistors.

BACKGROUND OF THE INVENTION

Large capacity, small size, and low standby current are demanded of memory installed in portable devices. Even though it is a characteristic that the standby current of an SRAM is one order of magnitude or smaller than that of a DRAM, the area of a memory cell is larger than that of a DRAM. It is therefore difficult to meet the demand of miniaturization.

Therefore, realization of an increase in capacity and a reduction in size was examined by applying a memory cell composed of four MOS transistors to the SRAM. However, there is a problem that the standby current increases because a memory cell consisting of four MOS transistors has to store the data using an off current of the MOS transistor.

The following is the prior art to solve this problem.

US 2003/0032250 discloses a technique for reducing the leakage current of a memory cell in the standby mode in an SRAM having a memory cell comprising two PMOS transistors as access MOS transistors and two NMOS transistors as drive MOS transistors.

U.S. Pat. No. 6,212,124 discloses a circuit technique to realize the retention of storage data and the reduction in leakage current in an SRAM having a memory cell comprising two PMOS transistors as access MOS transistors and two NMOS transistors as drive MOS transistors by controlling the word line voltage of the non-selected memory cell.

US2002/51379 discloses a technique for ensuring stability in read mode in an SRAM having a memory cell comprising two PMOS transistors as access MOS transistors and two NMOS transistors as drive MOS transistors by controlling the word line voltage of the selected memory cell in read mode to be smaller than 90% of the power-supply voltage.

FIG. 13 illustrates a configuration of memory cell MC comprising the PMOS transistors (MP1 and MP2) as the access MOS transistors and NMOS transistors (MN1 and MN2) as the drive MOS transistors. Each gate of PMOS transistors MP1 and MP2 is connected to the word line WL. The source of PMOS transistor MP1 is connected to one (BT) of the bit line pairs (BT and BB), and the drain is connected to one of the storage nodes NL. On the other hand, the source of PMOS transistor MP2 is connected to another (BB) of the bit line pairs (BT and BB), and the drain is connected to another of the storage nodes NR. The drain of NMOS transistor MN1 and the gate of NMOS transistor MN2 are connected to the storage node NL. On the other hand, the drain of NMOS transistor MN2 and the gate of NMOS transistor MN1 are connected to the storage node NR. Each source of NMOS transistor MN1 and MN2 is connected to, for example, the ground voltage VSS of 0 V. The data of one bit are retained by holding one of the storage node pairs (NL and NR) of the memory cell MC to H (High) level and another to L (Low) level.

Next, a means of data retention of the memory cell MC shown in FIG. 13 will be explained. In this embodiment, it is assumed that the storage node NL is in the H level and the storage node NR is in the L level. The memory cell maintains the charge of the storage node NL which is in the H level using the leakage current IOFF(P) in the off mode of PMOS transistor MP1. Therefore, in the standby mode (in data retention mode), the power-supply voltage VDD (>VSS) is supplied to both the word line WL and the bit line pair (BT and BB). Thereby, the PMOS transistors MP1 and MP2 become OFF mode, and the power-supply voltage VDD is supplied through the bit line pair (BT and BB) to each of the drains of PMOS transistors MP1 and MP2 in off mode. The leakage current IOFF(P) of the PMOS transistor MP1 is controlled to be greater than the sum of the leakage current IOFF(N) of NMOS transistor MN1 in the off mode and the leakage current IG(N) of NMOS transistor MN2 in the on mode, thereby supplying a current (leakage current IOFF(P)) from the bit line BT to the storage node NL through the PMOS transistor MP1 and maintaining the H level (VDD). Moreover, the storage node NR is kept in the L level (VSS) by keeping the NMOS transistor MN2 in the on mode, the gate of which is connected to the storage node. As a result, the charge is retained in standby mode, and the data of one bit are stored.

As above described, even though there is a deviation in threshold voltage of the MOS transistor, in order to store the data in the memory cell, it is necessary that the leakage current IOFF(P) of the PMOS transistors (MP1 and MP2) be controlled to be greater than the sum of the leakage current IOFF(N) of the NMOS transistors (MN1 and MN2) and the leakage current IG(N). Moreover, the leakage current IOFF(P) of the PMOS transistors (MP1 and MP2) is preferably to be small, because the data retention current is determined according to the leakage current IOFF(P).

As a means of reducing the leakage current IOFF(P), the patent document 1 discloses a technique in which the thickness of the gate oxide film of the NMOS transistors (MN1 and MN2) is made thicker than the thickness of the gate oxide film of the PMOS transistors (MP1 and MP2). However, there are the following problems with this means.

The gate tunneling current of a MOS transistor increases with microfabrication. Therefore, it is necessary to increase the ratio of the thicknesses of the gate oxide films of NMOS transistor (MN1 and MN2) and PMOS transistor (MP1 and MP2) during microfabrication. As a result, the ratio of the current drivabilities of the NMOS transistor (MN1 and MN2) and the PMOS transistor (MP1 and MP2) (hereinafter called the cell ratio) becomes smaller.

Moreover, variations in processing, fluctuations in channel impurity concentration, and the deviation of the MOS transistor threshold voltage increase with microfabrication. Therefore, in order to keep the data retention current small, it is necessary to increase the threshold voltage of the NMOS transistors (MN1 and MN2). As a result, the cell ratio becomes smaller.

FIG. 14 shows a simulated result of the relationship between the storage node voltage and the cell ratio in read mode. Here, the simulation was carried out assuming that L level is kept in the storage node NR. As shown in FIG. 14, it is clear that the voltage of the storage node increases with decreasing cell ratio. Accordingly, the drive MOS transistor MN1 carries a current corresponding to the voltage of the storage node NR. As a result, two drive MOS transistors (MN1 and MN2) carry the current, resulting in increasing power consumption and decreasing the reading current. Moreover, in the worst case, the storage data might be destroyed.

In the case when the data retention current does not create a problem, a means of increasing the leakage current flowing in the PMOS transistors (MP1 and MP2) may be acceptable. However, the following problems arise when increasing IOFF(P) As described in the patent document 4, the reading current flowing in the access memory cell MC decreases by the leakage current IOFF(P) flowing in the non-access memory cell MC in read mode. In the worst case, it would be impossible to read the data. As described in U.S. Pat. No. 6,259,623 (JP-A No. 6370/2001), this problem can be solved by decreasing the number of memory cells MC connected to the bit line pair (BT and BB). However, a decrease in the number of memory cells MC connected to the bit line pair (BT and BB) brings an increase in the area of a chip, consequently, the chip area reduction effects of a four-transistor memory cell MC configuration are lost.

SUMMARY OF THE INVENTION

It is an object of the present invention to increase the stability of a memory cell MC in read mode. When this object is achieved, it is possible to increase the thickness of the gate oxide film of the NMOS transistors (MN1 and MN2) and the threshold voltage: thereby, a reduction in the data retention current of the memory cell MC and ensured stability in read mode can be achieved simultaneously.

The following is a brief description of typical embodiments disclosed in the present invention.

A semiconductor memory device according to the present invention, which has a plurality of memory cells, comprises:
  word lines placed along the column-wise direction;
  bit line pairs placed along the row-wise direction;
  a first transistor having a first conductive type, in which the source is connected to one of the aforementioned bit line pairs and the gate is connected to one of the aforementioned word lines;
  a second transistor having a first conductive type, in which the source is connected to another of the aforementioned bit line pairs and the gate is connected to one of the aforementioned word lines;
  a third transistor consisting of a second conductive type having a greater carrier mobility than aforementioned first conductive type, said third transistor having the drain connected to the drain of aforementioned first transistor, the gate connected to the drain of aforementioned second transistor, and the source connected to a ground line; and
  a fourth transistor having aforementioned second conductive type, said fourth transistor having the drain connected to the drain of aforementioned second transistor, the gate connected to the drain of aforementioned first transistor, and the source connected to a ground line,
wherein a voltage between the gate and source in read mode of first and second transistors of the memory cell connected to the selected word line is controlled to be smaller than a voltage between the gate and source in write mode of a first and second transistor of a memory cell connected to the selected word line.

U.S. Pat. No. 6,212,124 discloses a circuit technique to control the voltage of the word line WL of the memory cell MC. However, this invention discloses a different technique because the voltage of a selected word line is controlled, whereas the patent document 2 discloses a means of controlling the voltage of non-selected word line WL.

Moreover, US2002/51379 discloses a technique, wherein the voltage of the selected word line in read mode is controlled to be smaller than 90% of the power-supply voltage. However, this invention discloses a different technique because the memory cell MC comprises PMOS transistor as the access MOS transistor and NMOS transistor as the drive MOS transistor, whereas the patent document 3 discloses that the memory cell comprises NMOS transistor as the access MOS transistor and PMOS transistor as the drive MOS transistor.

This invention provides a way for improving the stability of a memory cell in read mode in an SRAM that has the memory cell composed of two access MOS transistors and two drive MOS transistors.

DETAILED DESCRIPTION OF THE PREFERRED EMBODIMENTS

Figure 1:
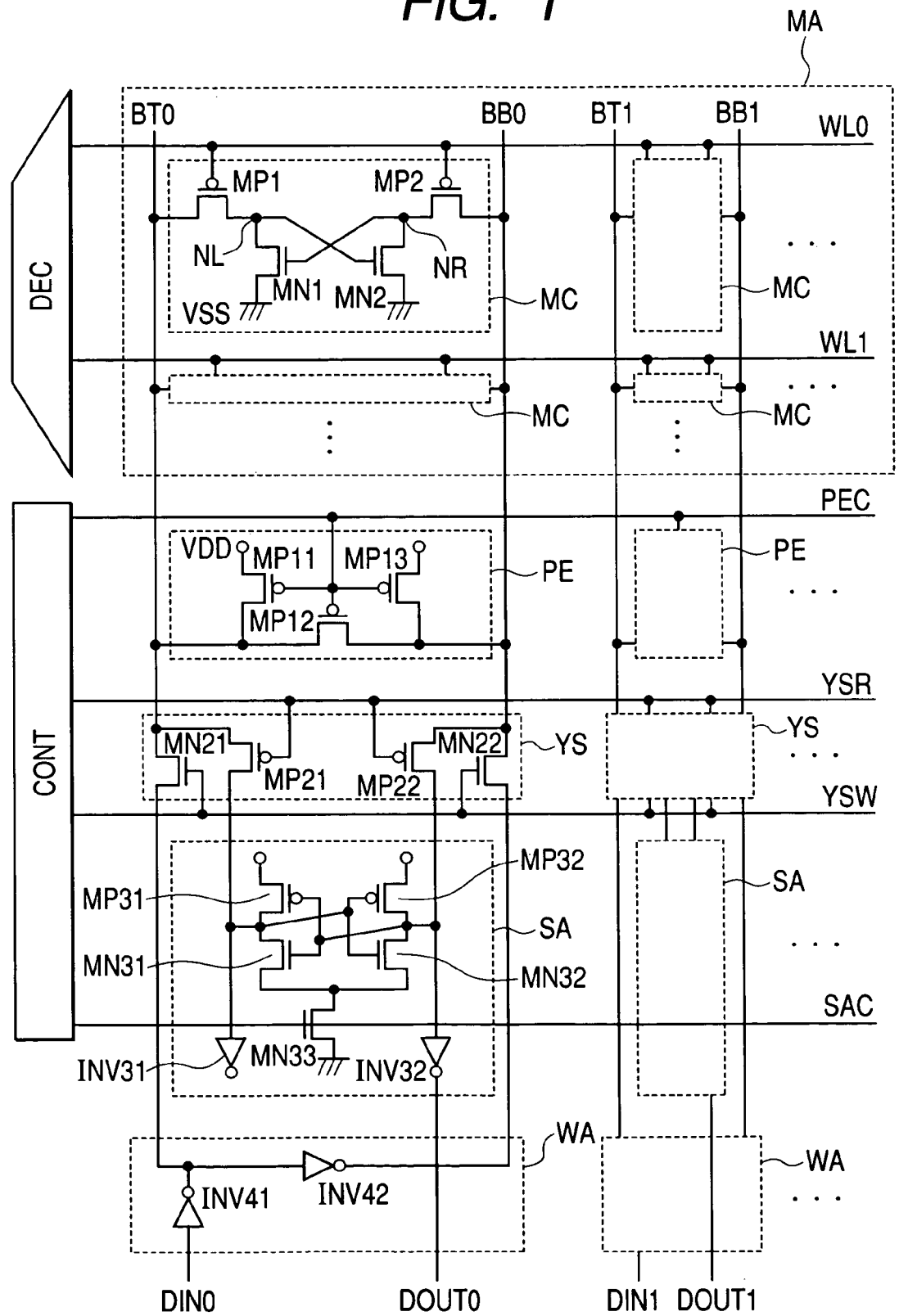
FIG. 1 is a schematic circuit diagram of an SRAM illustrating the first embodiment.

The following is a detailed explanation of the ways of executing this invention, referring to the drawings. In all figures explaining embodiments, the same symbol is assigned to the circuit with the same function, thereby omitting repetitive explanations.

First Embodiment

FIG. 1 shows an embodiment of an SRAM applying this invention. The SRAM shown in FIG. 1 is composed of memory array MA, decoder circuit DEC, pre-charge and equalize circuit PE, Y switch circuit YS, sense amplifier SA, write amplifier WA, and control circuit CONT.

Memory array MA is composed of a plurality of memory cells MC placed at the intersections of a plurality of bit line pairs (BT, BB) ((BT0, BB0), (BT1, BB1), . . . ) and a plurality of word lines WL (WL0, WL1, . . . ).

Memory cell MC is composed of PMOS transistors MP1, MP2, and NMOS transistors MN1, and MN2. Each gate of PMOS transistor MP1 and MP2 is connected to the word line WL (WL0, WL1, . . . ). The source of PMOS transistor MP1 is connected to BT (BT0, BT1, . . . ), and the drain is connected to one of the storage nodes NL. On the other hand, the source of PMOS transistor MP2 is connected to bit line BB (BB0, BB1, . . . ), and the drain is connected to another of the storage nodes NR. The drain of NMOS transistor MN1 and the gate of NMOS transistor MN2 are connected to the storage node NL. On the other hand, the drain of NMOS transistor MN2 and the gate of NMOS transistor MN1 are connected to the storage node NR. Each source of NMOS transistors MN1 and MN2 is connected to ground voltage VSS.

Decoder DEC is a circuit addressing one word line from a plurality of word lines WL according to a plurality of address signals, and it is composed of an address decoder and a plurality of word drivers WD.

Figure 2:
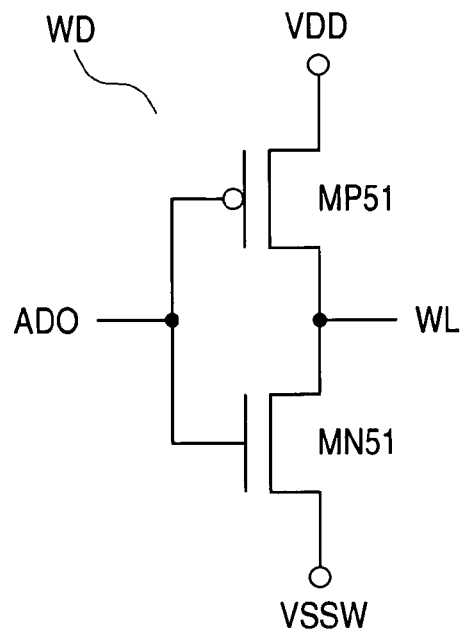
FIG. 2 is a schematic circuit diagram of a word driver illustrating the first embodiment.

FIG. 2 shows an example of the structure of a word driver WD in this embodiment. Word driver WD is composed of PMOS transistor MP51 and NMOS transistor MN51. The source of PMOS transistor MP51 is connected to the power-supply voltage VDD and the drain is connected to the word line, respectively. On the other hand, the source of NMOS transistor MN51 is connected to the intermediate voltage VSSW between the power-supply voltage VDD and ground voltage VSS, while the drain is connected to the word line, respectively. Address decoder output ADO is input to the gates of PMOS transistor MP51 and NMOS transistor MN51.

When address decoder output ADO is H level, the output of word driver WD becomes VSSW and, when ADO is L level, it becomes power-supply voltage VDD.

Therefore, the voltage of selected word line WL becomes intermediate voltage VSSW and the voltage of non-selected word line WL becomes power-supply voltage VDD.

Pre-charge and equalize circuit PE is a circuit pre-charging and equalizing bit line pair (BT, BB), and is composed of PMOS transistors MP11, MP12, and MP13. Pre-charge and equalize circuit PE is controlled by pre-charge and equalize circuit control signal PEC.

Y switch circuit YS is composed of PMOS transistors MP21 and MP22 that connects sense amplifier SA with bit line pair (BT, BB) and NMOS transistors MN21 and MN22 that connect write amplifier WA with bit line pair (BT, BB). Y switch circuit YS is controlled by two Y switch circuit control signals YSR and YSW.

Sense amplifier SA is a circuit for amplifying the minute voltage difference generated in bit line pair (BT, BB) in read mode, and it is composed of a latch type sense amplifier amplifying minute voltage differences and inverter circuits INV31 and INV32 that transmit amplified data. The latch type sense amplifier is composed of PMOS transistors MP31, MP32, and NMOS transistors MN31, MN32 and MN33. Sense amplifier SA is controlled by sense amplifier circuit control signal SAC.

Write amplifier WA is a circuit that feeds write data DIN (DIN0, DIN1, . . . ) to bit line pair (BT, BB), and it is composed of inverter circuit INV41 and INV42.

Control circuit CONT is a circuit that generates control signals PEC, YSR, YSW, and SAC that control pre-charge and equalize circuit PE, Y switch circuit YS, and sense amplifier SA.

Figure 3:
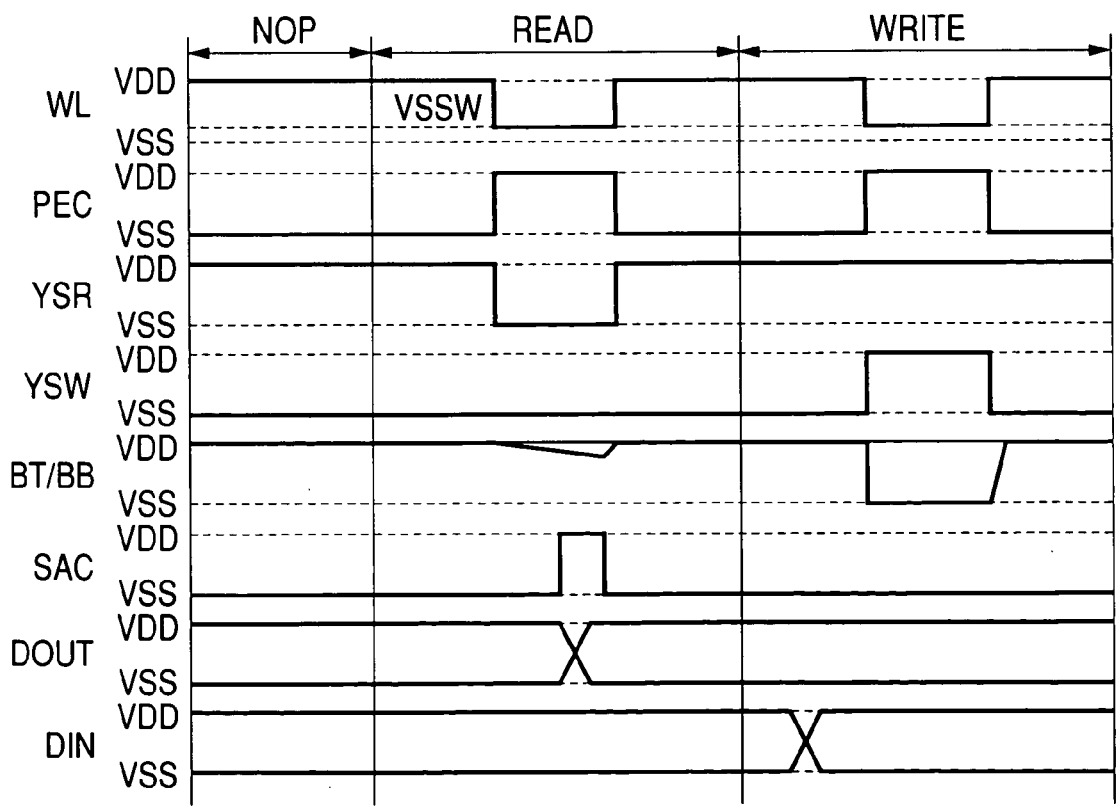
FIG. 3 is an operating waveform of an SRAM illustrating the first embodiment.

Next, the operation of the SRAM in this embodiment will be described using the operation waveform of FIG. 3. When both the read mode READ and write mode WRITE are not carried out (NOP), the pre-charge and equalize circuit control signal PEC becomes L level, Y switch circuit control signal YSR becomes H level, YSW is L level, and sense amplifier circuit control signal SAC is L level.

Read mode READ is performed as follows. When the address signals or clock signals are input, the address signals are decoded by decoder DEC, and one word line WL is selected. Simultaneously, pre-charge and equalize circuit control signal PEC shifts from L level to H level, while Y switch circuit control signal YSR shifts from H level to L level, respectively. As a result, bit line pair (BT, BB) is connected to sense amplifier SA, and a minute voltage difference is generated in bit line pair (BT, BB). When sense amplifier circuit control signal SAC shifts from L level to H level, the sense amplifier SA is activated, the minute voltage difference generated in bit line pair (BT, BB) is amplified, and read data appear at external output DOUT (DOUT0 and DOUT1, . . . ).

On the other hand, write mode WRITE is performed as follows. When the address signals or clock signals are input, the address signals are decoded by decoder DEC, and one word line WL is selected. Simultaneously, pre-charge and equalize circuit control signal PEC shifts from L level to H level, while Y switch circuit control signal YSW shifts from L level to H level, respectively. As a result, the bit line pair (BT, BB) is connected to the write amplifier WA, and external input data DIN (DIN0 and DIN1, . . . ) are input to bit line pairs (BT, BB) ((BT0, BB0) and (BT1, BB1), . . . ) through write amplifiers WA. Data input to bit line pairs (BT, BB) ((BT0, BB0) and (BT1, BB1), . . . ) are written to memory cells MC connected to the selected word line.

In the following embodiment is described an explanation why the stability of memory cell MC increases in read mode READ.

The voltage of selected word line WL in read mode READ is controlled by word driver WD at an intermediate middle voltage VSSW between ground voltage VSS and power-supply voltage VDD.

The magnitude of the voltage between the gate and source of PMOS transistors MP1 and MP2 of memory cell MC connected to selected word line WL becomes |VSSW−VDD| because it is determined by the voltage difference between word line WL and bit line (BT, BB).

As a result, the current drivability of PMOS transistors MP1 and MP2 decreases, compared with the case when the magnitude of the voltage between the gate and source is |VSS−VDD|. Therefore, the stability of memory cell MC improves because the cell ratio increases.

Figure 4:
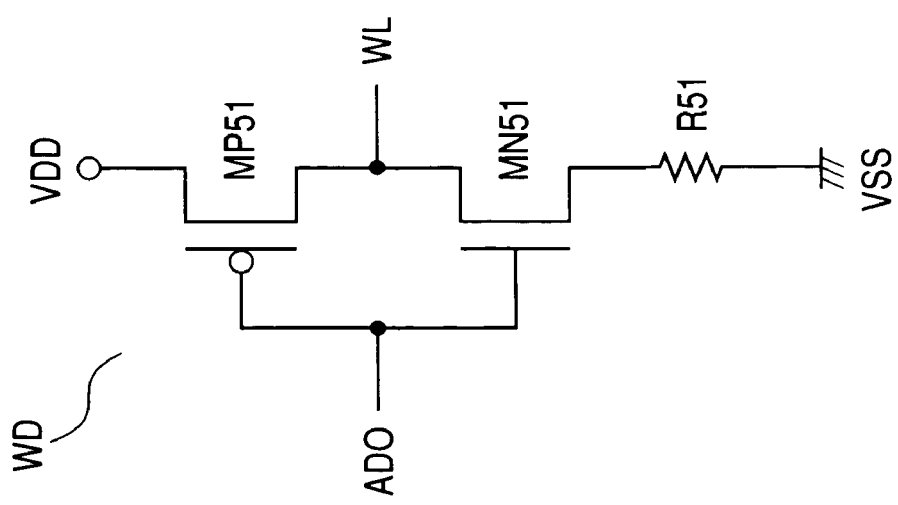
FIG. 4 is a schematic circuit diagram of a word driver illustrating the first embodiment.

The above-described intermediate voltage VSSW can be generated by using a voltage down converter to step down either the power-supply voltage VDD of an SRAM or the power-supply voltage VCC used for an input/output circuit. The circuits described in JP-A No. 174612/1991 can be used for the voltage down converter. Also, as shown in FIG. 4, the intermediate voltage VSSW can be obtained by connecting resistance R51 in series between the source of NMOS transistor MN51 and ground voltage VSS.

According to this embodiment, the stability of memory cell MC in read mode READ can be improved.

Second Embodiment

Another embodiment is shown, in which data writing can be made faster than that in the first embodiment. Because the composition of the SRAM in this embodiment is the same as in FIG. 1, only the differing parts will be explained.

Figure 5:
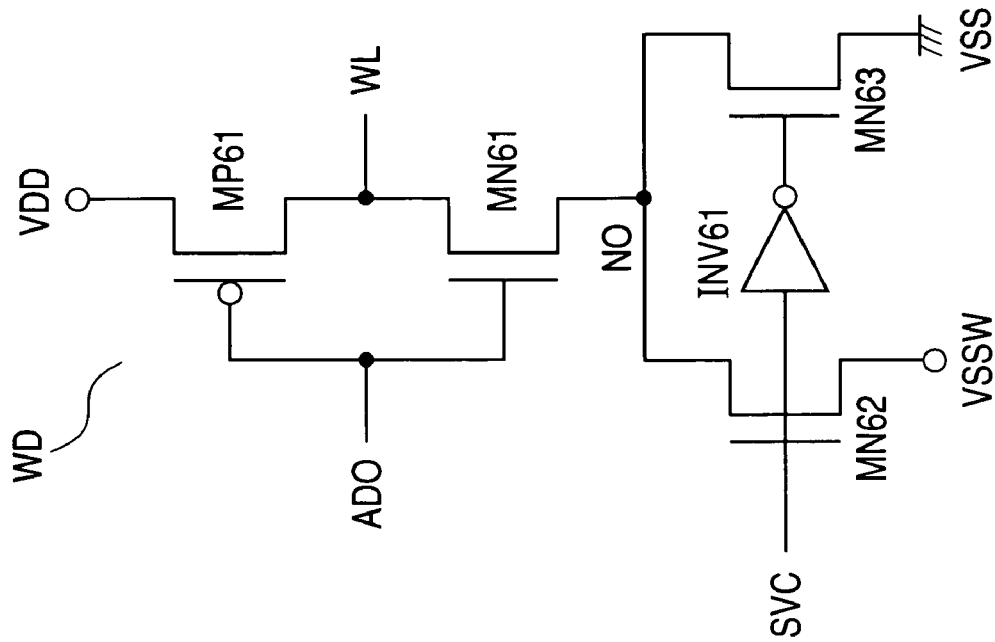
FIG. 5 is a schematic circuit diagram of a word driver illustrating the second embodiment.

FIG. 5 is an example of a structure illustrating an embodiment of a word driver WD. Word driver WD is composed of PMOS transistor MP61, NMOS transistors MN61, MN62, MN63, and inverter circuit INV61. The source and drain of PMOS transistor MP61 are connected to the power-supply voltage VDD and the word line WL, respectively. The source and drain of NMOS transistor MN61 are connected to the node N0 and the word line WL, respectively. Address decoder output AD0 is input to the gates of PMOS transistor MP61 and NMOS transistor MN61. The source and drain of NMOS transistor MN62 are input to the intermediate voltage VSSW between ground voltage VSS and power-supply voltage VDD, and to node N0, respectively, while the source voltage control signal SVC is input to the gate. The source and drain of NMOS transistor MN63 are connected to ground voltage VSS and to node N0, respectively, while the inverted signal of the source voltage control signal SVC is input to the gate. The inverted signal of the source voltage control signal SVC is obtained by inverting source voltage control signal SVC with inverter circuit INV61.

Word driver WD in this embodiment can be considered to comprise an inverter circuit consisting of PMOS transistor MP61 and NMOS transistor MN61, and an inverter circuit INV61, and NMOS transistors MN62 and MN63, that control the source voltage of NMOS transistor MN61. Therefore, if the word driver WD is composed of an inverter circuit and a plurality of word drivers WD share the circuit controlling the source voltage of NMOS transistor of the inverter circuit, the area can be decreased.

Source voltage control signal SVC of word driver WD connected to selected word line WL is controlled to be the L level and the H level during write mode WRITE and read mode READ, respectively. Therefore, the voltage of selected word line WL becomes intermediate voltage VSSW in read mode READ and ground voltage VSS in write mode WRITE. On the other hand, the voltage of non-selected word line WL is voltage VDD.

The level of source voltage control signal SVC of word driver WD connected to non-selected word line WL is preferably H level, although it is not limited thereto. Because the voltage impressed on word driver WD decreases in the case of H level, the leakage current flowing to word driver WD can be decreased.

Figure 6:
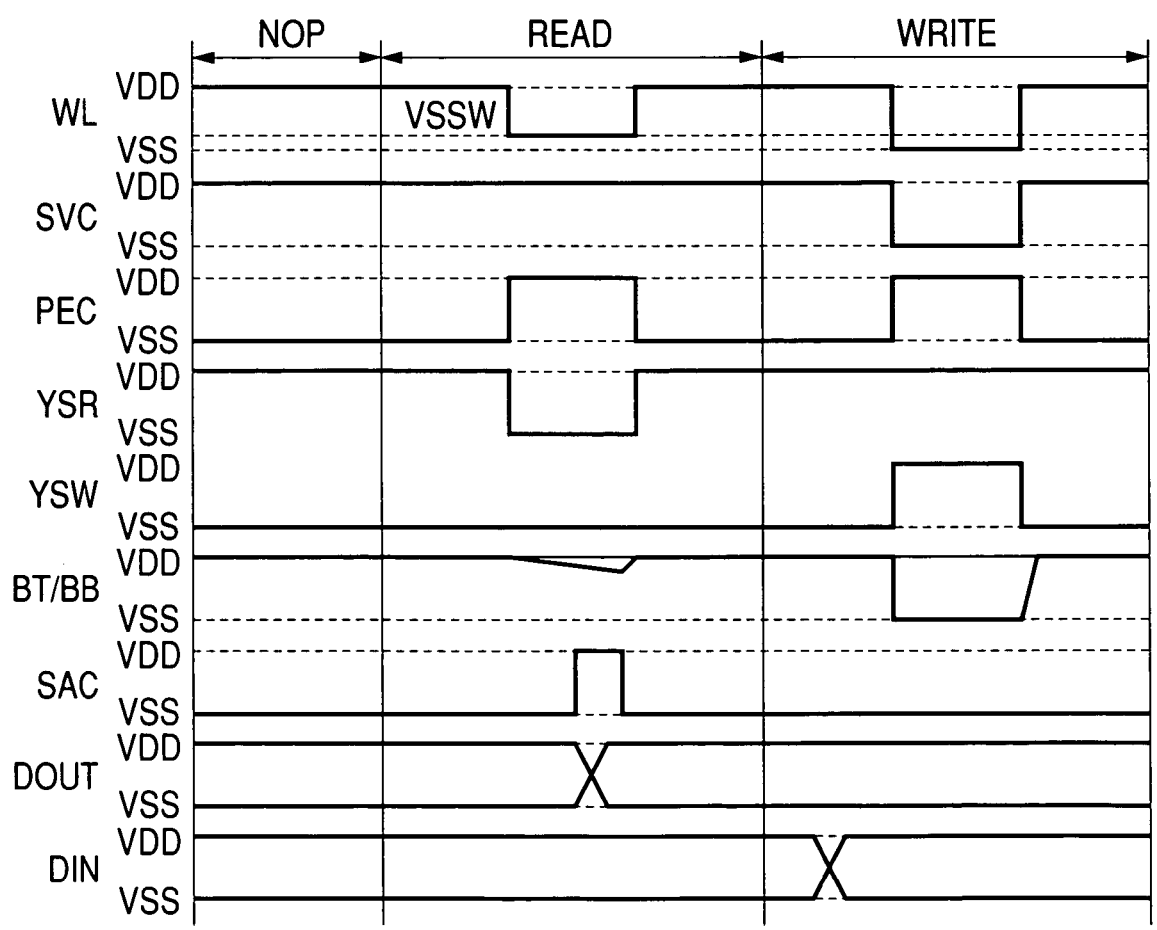
FIG. 6 is an operating waveform of an SRAM illustrating the second embodiment.

The following are illustrative of the operation of an SRAM in the present embodiment using an operating waveform of FIG. 6. When both the read mode READ and write mode WRITE are not carried out (NOP), the source voltage control signal SVC becomes H level, the pre-charge and equalize circuit control signal PEC becomes L level, Y switch circuit control signal YSR is H level, YSW is L level, and sense amplifier control signal SAC is L level.

Read mode READ is performed as follows:

When the address signals or clock signals are input, the address signals are decoded by decoder DEC, and one word line WL is selected. Since the source voltage control signal SVC in read mode READ is H level, the voltage of selected word line WL becomes the intermediate voltage VSSW. At the same time as word line WL is accessed, pre-charge and equalize circuit control signal PEC shifts from L level to H level, while Y switch circuit control signal YSR shifts from H level to L level, respectively. As a result, sense amplifier SA is connected to bit line pair (BT, BB), and a minute voltage difference is generated in bit line pair (BT, BB). When sense amplifier control signal SAC shifts from L level to H level, the sense amplifier SA is activated, the minute voltage difference generated in bit line pair (BT, BB) is amplified, and read data appears at external output DOUT (DOUT0, DOUT1, . . . ).

On the other hand, write mode WRITE is performed as follows. When the address signals or clock signals are input, the address signals are decoded by decoder DEC, and one word line WL is selected. Simultaneously, the source voltage control signal SVC shifts from H level to L level, pre-charge and equalize circuit control signal PEC shifts from L level to H level, while Y switch circuit control signal YSW shifts from L level to H level, respectively. As a result, the voltage of selected word line WL becomes ground voltage VSS. Moreover, the bit line pair (BT, BB) is connected to the write amplifier WA, and external input data DIN (DIN0 and DIN1, . . . ) are input to bit line pairs (BT, BB) ((BT0, BB0), (BT1, BB1), . . . ) through write amplifiers WA. Data input to bit line pairs (BT, BB) ((BT0, BB0), (BT1, BB1), . . . ) are written to memory cells MC connected to the selected word line WL. After the write mode WRITE is finished, the source voltage control signal SVC returns to H level.

The following is illustrative of the reason why the data writing speed can be increased according to this embodiment. Because the voltage of selected word line WL is controlled by VSS in write mode WRITE, the magnitude of the voltage between the gate and source of PMOS transistors MP1 and MP2 of memory cell MC connected to selected word line WL becomes |VSS-VDD|. As a result, since the current drivability of PMOS transistors MP1 and MP2 becomes greater than the magnitude of the voltage between the gate and source |VSSW-VDD|, the writing time decreases.

On the other hand, in read mode READ, since the voltage of selected word line WL is controlled at intermediate voltage VSSW, for the reasons explained in the first embodiment, the stability of memory cell MC is improved.

According to this embodiment, write mode WRITE can be done faster than the first embodiment.

Third Embodiment

Figure 7:
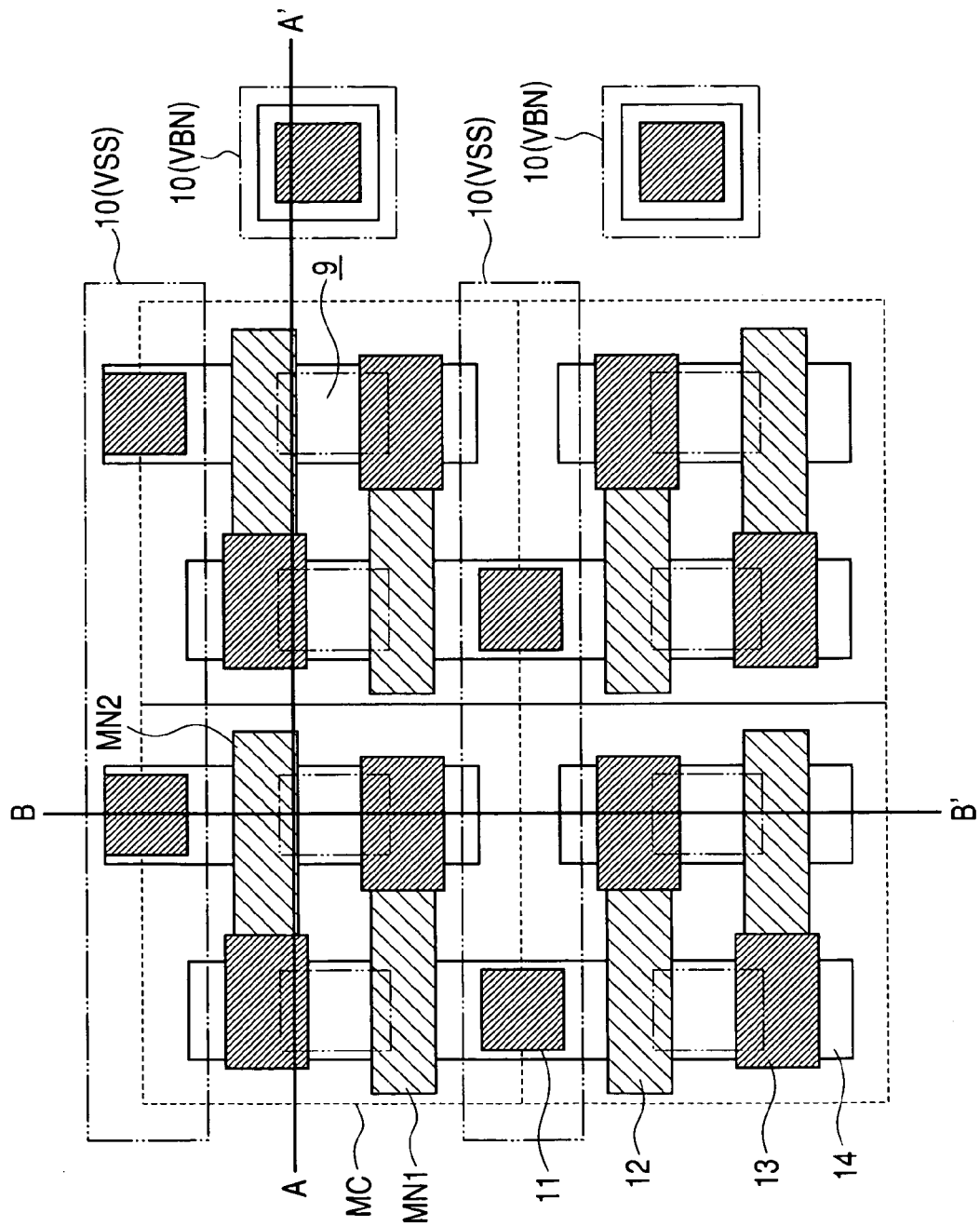
FIG. 7 is a layout diagram of a memory cell illustrating the third embodiment.
Figure 8:
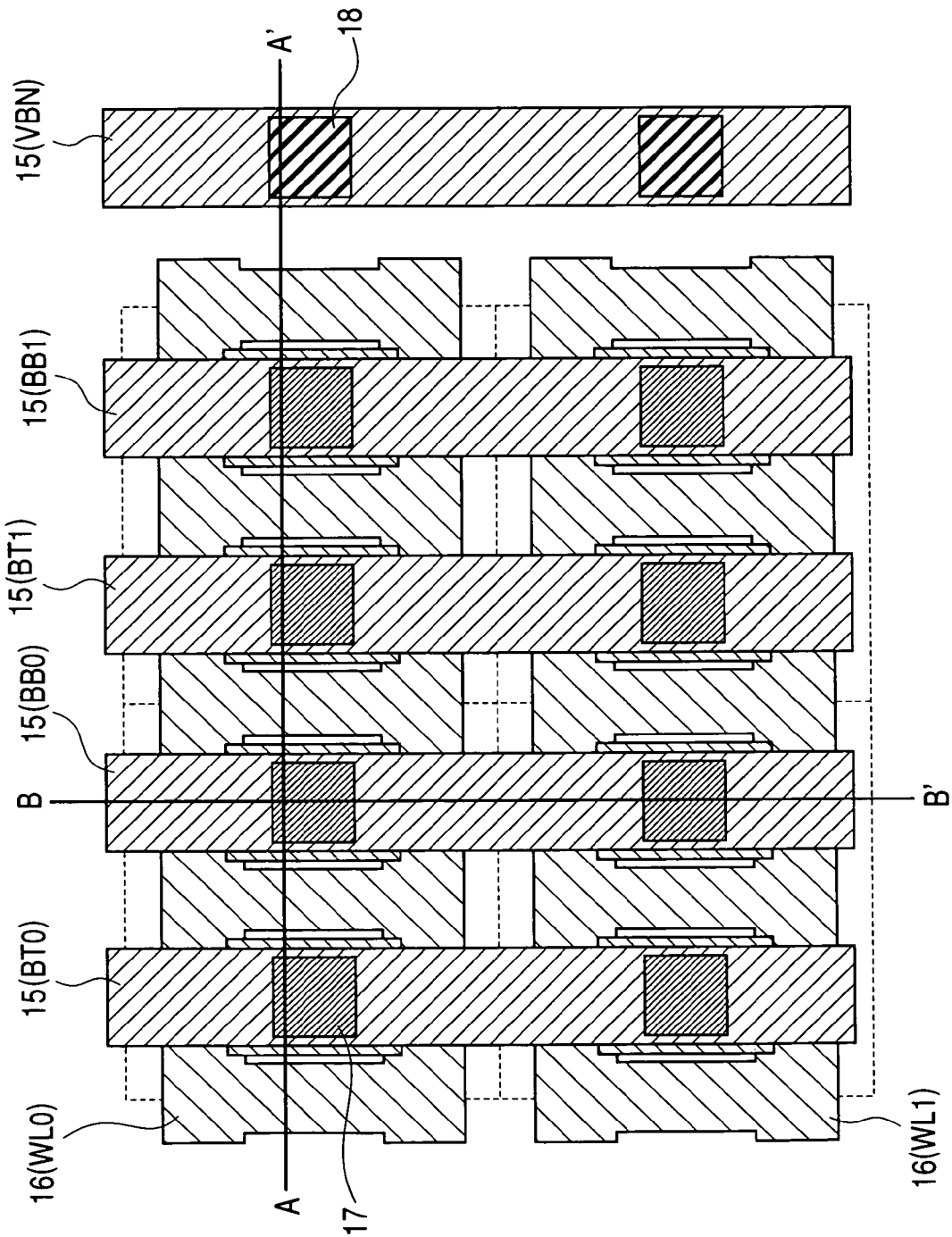
FIG. 8 is a layout diagram of a memory cell illustrating the third embodiment.

FIGS. 7 and 8 are layout examples illustrating the first and second embodiments, respectively, wherein PMOS transistors (MP1, MP2) composing memory cell MC consist of vertical MOS transistors that can be stacked on a semiconductor substrate. 10 and 15 are interconnect layers; 11, 13, 17, and 18 are contact holes; 12 and 16 are gate poly-electrode; and 14 is an active region. Metallic materials such as Al and Cu etc. are generally used as a material for the interconnect layer, but poly-silicon may also be used. 9 and 10 are the same layer, but 9 is used as a plug connecting drain of NMOS transistor (MN1, MN2) to drain the vertical MOS transistor (MP1, MP2). VBN is P-well voltage.

Figure 9:
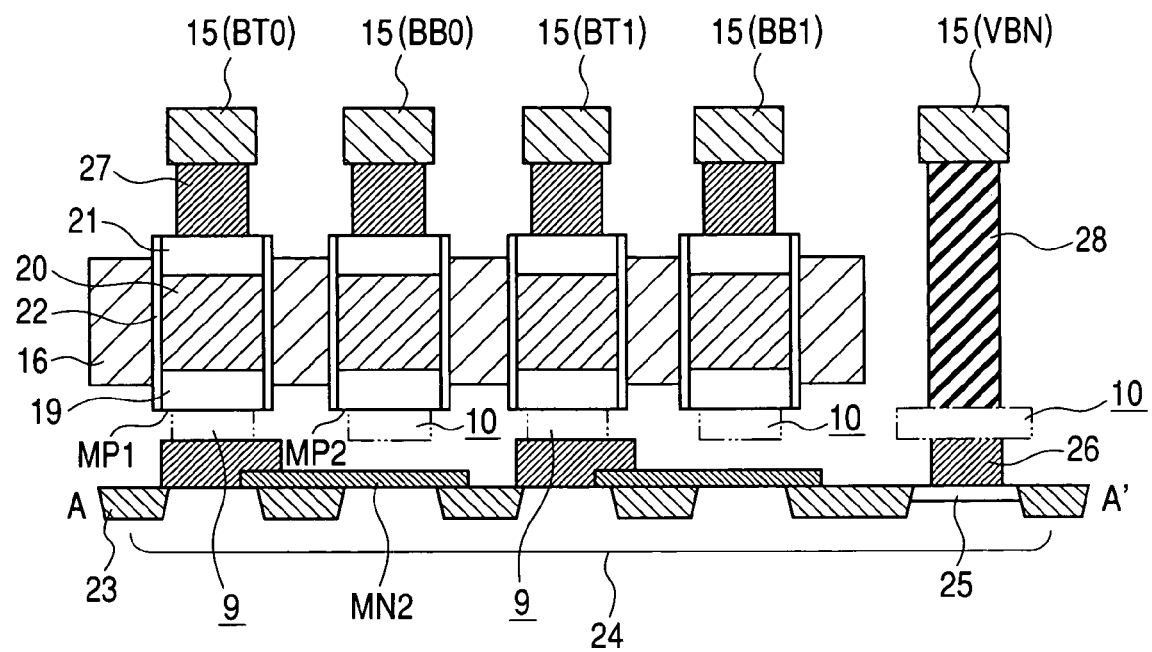
FIG. 9 is a layout diagram of a memory cell illustrating the third embodiment.
Figure 10:
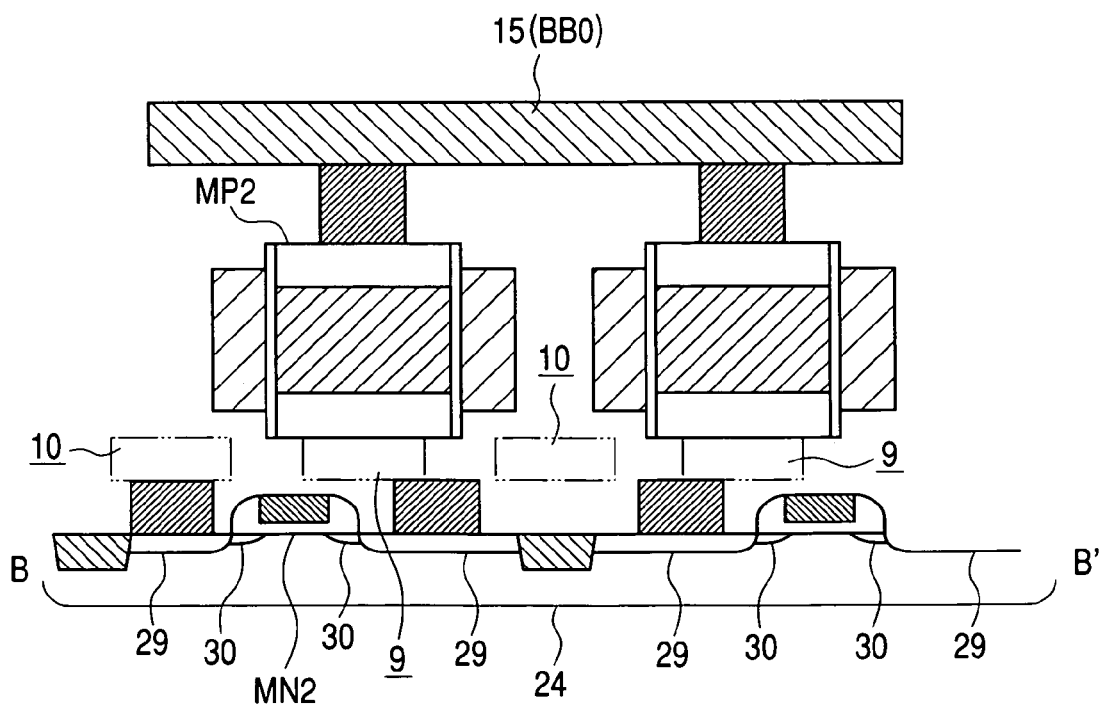
FIG. 10 is a layout diagram of a memory cell illustrating the third embodiment.

FIGS. 9 and 10 are cross-sections along the A–A' line and B–B' line in FIGS. 7 and 8. In these figures, 19 is the bottom layer of device, 20 is the middle layer of device, 21 is the top layer of device, 22 is a gate oxide, 23 is a field-insulating layer, 24 is a p-well, 25 is a p$^+$-type heavily doped layer, 26, 27, and 28 are plugs, 29 is an n$^+$-type heavily doped layer (source and drain), and 30 is an n$^-$-type lightly doped region.

Vertical MOS transistor consists of square pole-shaped (or cylindrical shaped) layered body SV, wherein bottom layer of the device 19 (drain), middle layer of the device 20, top layer of the device 21 (source) are laminated, and gate electrode 16 is formed on a side wall of the layered body SV through insulator 22. Since PMOS transistors (MP1, MP2) consist of vertical MOS transistors and, thereby, a well insulating layer does not need to be placed, it makes memory cell MC smaller than the case where all MOS transistors composing memory cell MC are formed on a semiconductor substrate.

Moreover, the same effect may be obtained even if PMOS transistors (MP1, MP2) are composed of thin film transistor (TFT) and stacked on NMOS transistors (MN1, MN2)

Forth Embodiment

The following are other embodiments to improve the stability of memory cell MC in read mode READ. However, only the parts being different from the first embodiment will be explained.

Figure 11:
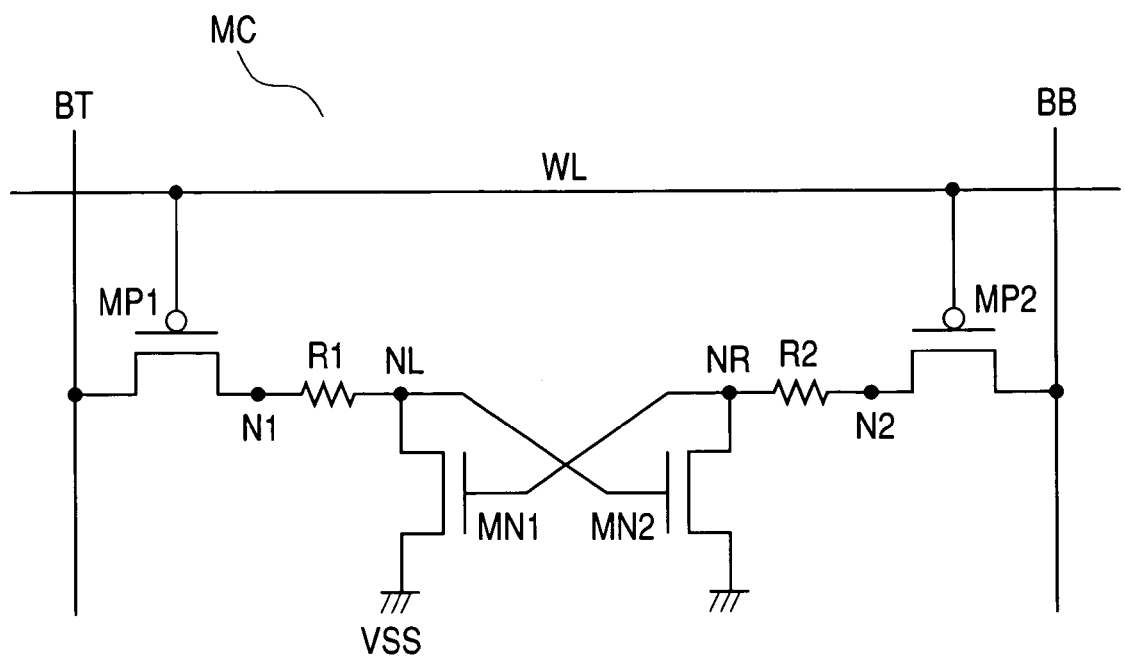
FIG. 11 is a configuration of a memory cell illustrating the fourth embodiment.

FIG. 11 is a structure illustrating an embodiment of memory cell MC. Memory cell MC consists of PMOS transistors MP1 and MP2, NMOS transistors MN1 and MN2, and resistances R1, and R2. Each gate of PMOS transistors MP1 and MP2 is connected to word line WL. Source and drain of MP1 are connected to one (BT) of bit line pair (BT, BB) and node N1, respectively. Source and drain of MP2 are connected to one (BB) of bit line pair (BT, BB) and node N2, respectively.

Gate, drain and source of MN1 are connected to node NR, node NL and ground voltage VSS, respectively. Gate, drain and source of MN2 are connected to node NL, node NR and ground voltage VSS, respectively. Resistance R1 is connected to node N1 and node NL, while resistance R2 is connected to node N2 and node NR. In the memory cell MC in the present embodiment, node pair (NL, NR) consists of a storage node and one retained at H (High) level and other at L (Low) level, thereby one bit of data is stored.

Not only the MOS transistor formed on a substrate, but also the vertical MOS transistor and thin film transistor (TFT) as shown in the third embodiment may be used for PMOS transistors (MP1, MP2).

Figure 12:
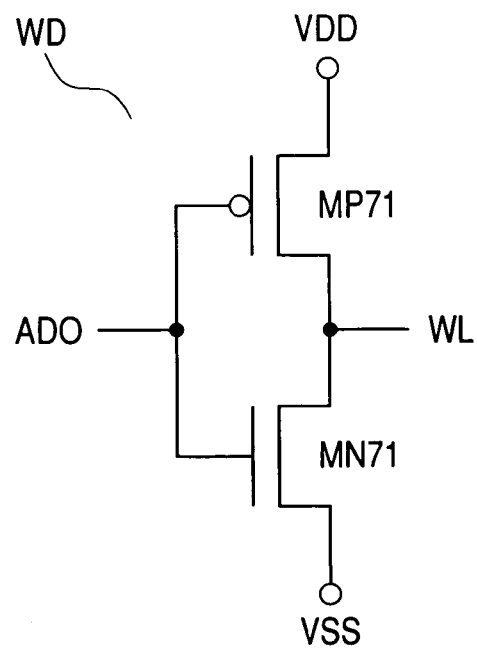
FIG. 12 is a schematic circuit diagram of a word driver illustrating the fourth embodiment.
Figure 13:
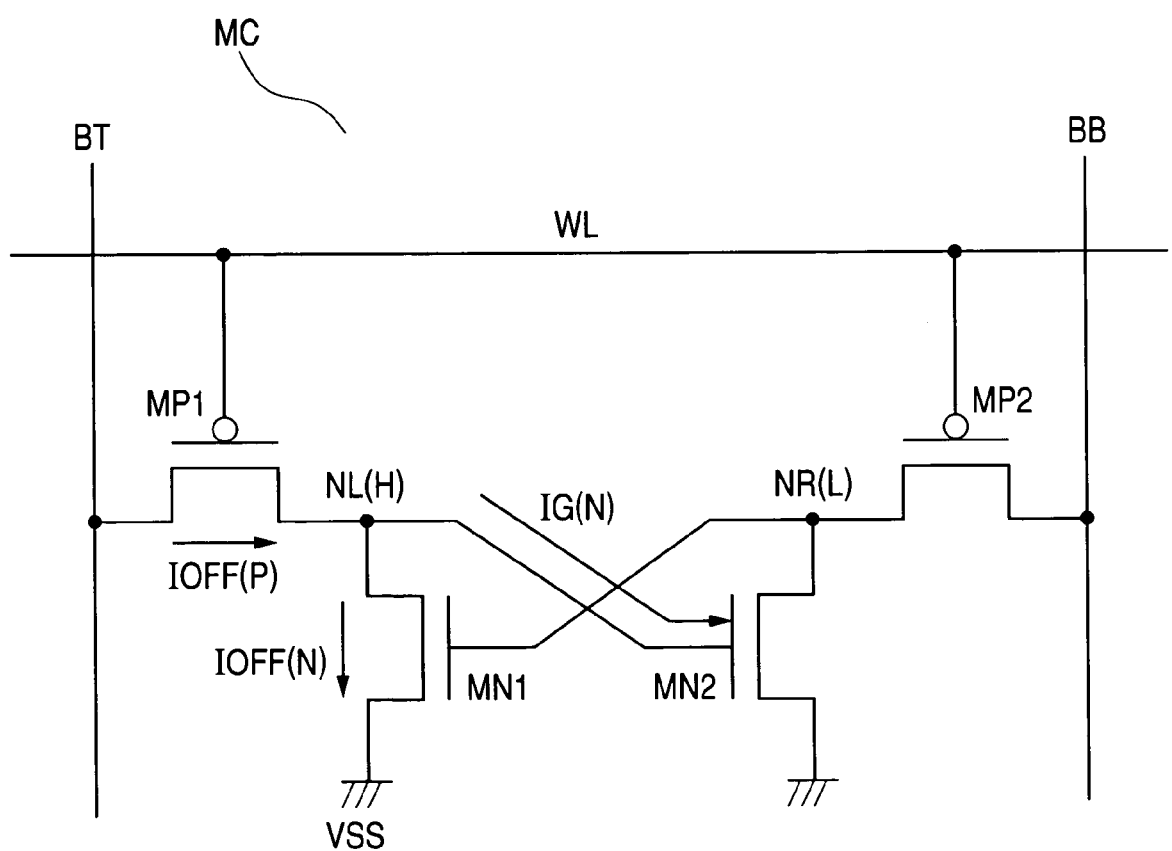
FIG. 13 is a configuration of memory cell MC.
Figure 14:
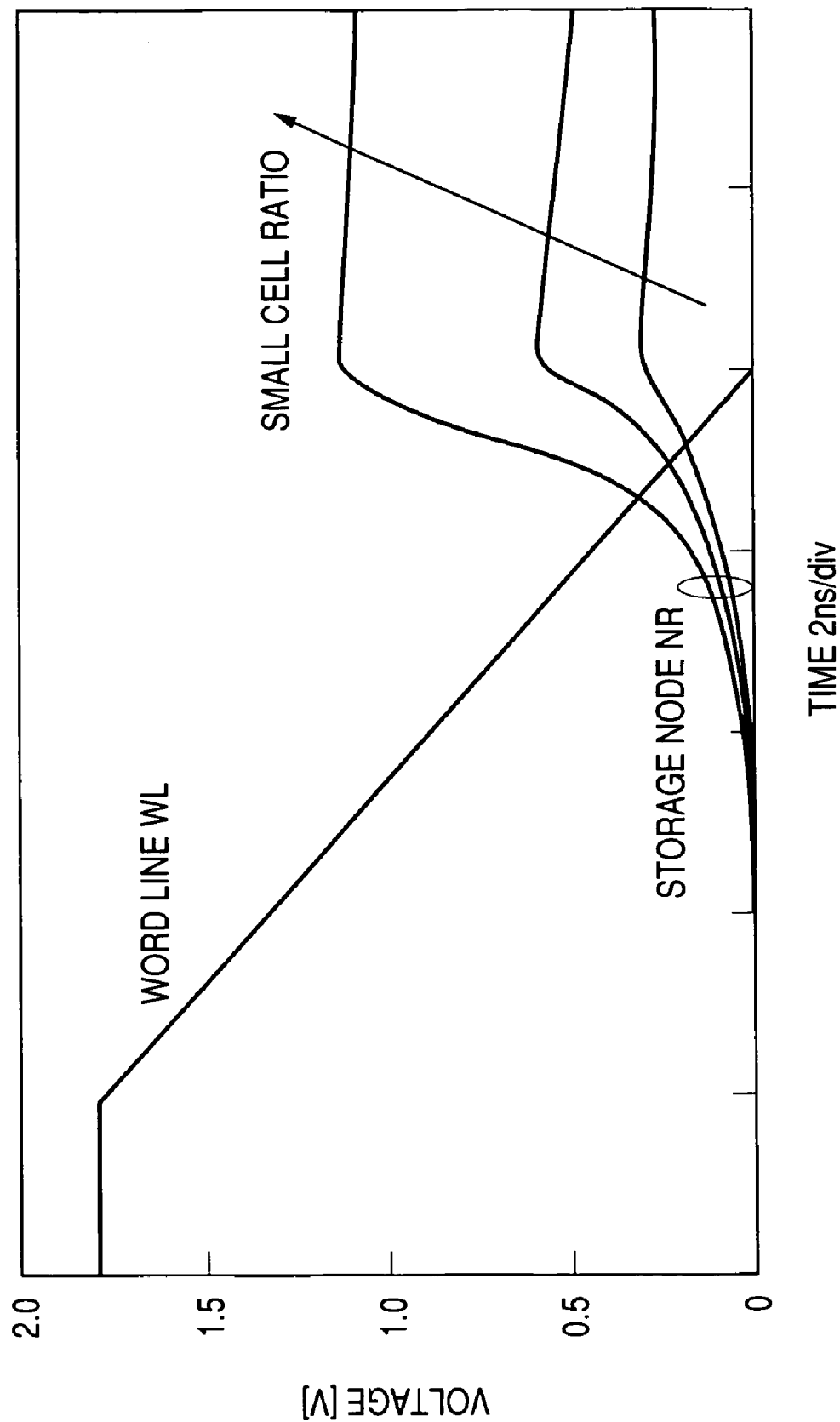
FIG. 14 is an operating waveform of memory cell MC in read mode.

FIG. 12 is a structure illustrating an embodiment of word driver WD. Word driver WD comprises PMOS transistor MP71 and NMOS transistor MN71. Source and drain of PMOS transistor MP71 are connected to power-supply voltage VDD and word line WL, respectively. On the other hand, source and drain of NMOS transistor MN71 are connected to ground voltage VSS and word line WL, respectively. Address decoder output ADO is input to gates of PMOS transistor MP71 and NMOS transistor MN71. Output of word driver WD becomes ground voltage VSS when the address decoder output ADO is H level and power-supply voltage VDD when it is L level.

Therefore, the voltage of selected word line WL becomes VSS, while the voltage of non-selected word line WL becomes power-supply voltage VDD.

The following is an explanation of effects illustrating the present embodiment. Since the voltage of selected word line WL is controlled by ground voltage VSS in read mode READ, the magnitude of the voltage between the gate and source of PMOS transistors MP1 and MP2 of memory cell MC connected to selected word line WL becomes |VSS−VDD|. Therefore, the drivability of PMOS transistors MP1 and MP2 becomes greater than that of the embodiments described above. However, current flowing in the storage nodes (NL, NR) decreases due to resistances R1 and R2, therefore the cell ratio can be made greater by controlling R1 and R2. Thus, even if the drivability of PMOS transistors MP1 and MP2 is great, the stability of memory cell MC will be improved.

According to this embodiment, stability of memory cell MC in read mode READ can be improved.

Although the resistance is inserted on the memory node side in this embodiment, a similar effect may be obtained even if it is inserted on the bit line side.

The means of inserting a resistance is also effective in SRAM having a memory cell, wherein two PMOS transistors are drive MOS transistors and two NMOS transistors are access MOS transistors.

Moreover, when the word driver WD described in the first and second embodiments is combined with the memory cell MC described in this embodiment, the stability of memory cell MC in read mode can further be improved.

What is claimed is:

1. A semiconductor memory device comprising a plurality of word lines placed along a first direction, a plurality of bit line pairs placed along a second direction intersecting said first direction, and a plurality of memory cells placed at intersections of said plurality of word lines and plurality of bit line pairs, each of said plurality of memory cells including:

first and second nodes;

a first PMOS transistor having a source-drain path between said first node and one of said bit line pairs, in which the gate is connected to said word line;

a second PMOS transistor having a source-drain path between said second node and another said bit line pair, in which the gate is connected to said word line;

a first NMOS transistor, in which the drain is connected to said first node and the gate is connected to said second node; and a second NMOS transistor, in which the drain is connected to said second node and the gate is connected to said first node, wherein a first voltage is applied to a word line of at least one of said plurality of memory cells selected in read mode, and wherein a second voltage less than said first voltage is applied to said word line of at least one of said plurality of memory cells selected in write mode.

2. A semiconductor memory device according to claim 1, wherein each said first and second transistor is a vertical MOS transistor including said first semiconductor layer, a second semiconductor layer laminated on said first semiconductor layer, and a third semiconductor layer laminated on said second semiconductor layer.

3. A semiconductor memory device according to claim 1, wherein the source and drain of said first and second NMOS transistors are formed on the main surface of a semiconductor substrate, and wherein the source and drain of said first and second PMOS transistors are formed on a surface different from said main surface.

4. A semiconductor memory device according to claim 1, wherein the leakage current of said first and second PMOS transistors is greater than the leakage current of said first and second NMOS transistors in a state storing the data in said memory cell.

5. A semiconductor memory device according to claim 4, wherein the supply voltage is applied to said plurality of word lines and said plurality of bit line pairs in a state where said memory cell stores data.

6. A semiconductor memory device comprising a plurality of word lines placed along a first direction, a plurality of bit line pairs placed along a second direction intersecting said first direction, and a plurality of memory cells placed at intersections of said plurality of word lines and plurality of bit line pairs, each of said plurality of memory cells including:

first and second nodes;

a first PMOS transistor having a source-drain path between said first node and one of said bit line pairs, in which the gate is connected to said word line;

a second PMOS transistor having a source-drain path between said second node and another said bit line pair, in which the gate is connected to said word line;

a first NMOS transistor, in which the drain is connected to said first node and the gate is connected with said second node; and a second NMOS transistor, in which the drain is connected to said second node and the gate is connected to said first node, wherein a voltage between the gate and source of first and second PMOS transistors of at least one of said plurality of memory cells selected in read mode is set to be smaller than the voltage between the gate and source of first and second PMOS transistors of at least one of said plurality of memory cells selected in write mode.

7. A semiconductor memory device according to claim 6, wherein the source and drain of said first and second NMOS transistors are formed on a main surface of a semiconductor substrate, and wherein the source and drain of said first and second PMOS transistors are formed on a surface different from said main surface.

8. A semiconductor memory device according to claim 6, wherein each said first and second transistor is a vertical MOS transistor consisting of said first semiconductor layer, a second semiconductor layer laminated on said first semiconductor layer, and a third semiconductor layer laminated on said second semiconductor layer.

9. A semiconductor memory device comprising a plurality of word lines placed along a first direction, a plurality of bit line pairs placed along a second direction intersecting said first direction, and a plurality of memory cells placed at intersections of said plurality of word lines and plurality of bit line pairs, each of said plurality of memory cells including:

first and second nodes;

a first PMOS transistor having a source drain path between said first node and one of said bit line pairs, wherein the gate is connected to said word line;

a second PMOS transistor having a source-drain path between said second node and another said bit line pair, in which the gate is connected to said word line;

a first NMOS transistor, in which a drain is connected with said first node and the gate is connected to said second node; and a second NMOS transistor, in which a drain is connected with said second node and the gate is connected to said first node, wherein a voltage lower than a supply voltage and higher than a around voltage is applied to a word line of at least one of said plurality of memory cells selected in read mode, wherein a source and drain of said first and second NMOS transistors are formed on a main surface of a semiconductor substrate, wherein a source and drain of said first and second PMOS transistors are formed on a surface different from said main surface.

10. A semiconductor memory device comprising a plurality of word lines placed along a first direction, a plurality of bit line pairs placed along a second direction intersecting said first direction, and a plurality of memory cells placed at intersections of said plurality of word lines and plurality of bit line pairs, each of said plurality of memory cells including:

first and second nodes:

a first PMOS transistor having a source drain path between said first node and one of said bit line pairs, wherein the gate is connected to said word line;

a second PMOS transistor having a source-drain path between said second node and another said bit line pair, in which the gate is connected to said word line;

a first NMOS transistor, in which a drain is connected with said first node and the gate is connected to said second node; and a second NMOS transistor, in which a drain is connected with said second node and the gate is connected to said first node, wherein a voltage lower than a supply voltage and higher than a ground voltage is applied to a word line of at least one of said plurality of memory cells selected in read mode, wherein each of said first and second transistors is a vertical MOS transistor including said first semiconductor layer, a second semiconductor layer laminated on said first semiconductor layer, and a third semiconductor layer laminated on said second semiconductor layer.

* * * * *